(12) United States Patent
Tsung-Lin

(10) Patent No.: US 6,799,394 B2
(45) Date of Patent: Oct. 5, 2004

(54) APPARATUS FOR SEALING A VACUUM CHAMBER

(76) Inventor: Shen Tsung-Lin, No. 262, Baimi Rd., Gangshan Jen, Kaohsiung (TW)

(*) Notice: Subject to any disclaimer, the term of this patent is extended or adjusted under 35 U.S.C. 154(b) by 258 days.

(21) Appl. No.: 10/050,180

(22) Filed: Jan. 18, 2002

(65) Prior Publication Data

US 2003/0136343 A1 Jul. 24, 2003

(51) Int. Cl.$^7$ .............................................. E05D 15/10
(52) U.S. Cl. .............................. 49/209; 49/356; 49/372
(58) Field of Search ........................ 49/356, 348, 349, 49/372, 374, 208, 209, 216, 218, 219, 220; 220/345.1

(56) References Cited

U.S. PATENT DOCUMENTS

| | | | | | |
|---|---|---|---|---|---|
| 2,227,712 | A | * | 1/1941 | Hackley ..................... | 220/314 |
| 2,614,835 | A | * | 10/1952 | Margison et al. ........... | 160/188 |
| 2,701,394 | A | * | 2/1955 | Anderson ................... | 49/212 |
| 3,131,925 | A | * | 5/1964 | Coats ......................... | 49/216 |
| 3,386,206 | A | * | 6/1968 | Walter ........................ | 49/221 |
| 3,694,960 | A | * | 10/1972 | Miraldi ....................... | 49/209 |
| 3,885,349 | A | * | 5/1975 | Owen ......................... | 49/220 |
| 4,170,845 | A | * | 10/1979 | Owen ......................... | 49/220 |
| 4,432,164 | A | * | 2/1984 | Baguet ........................ | 49/209 |
| 4,832,527 | A | * | 5/1989 | Bachmann ................... | 405/105 |
| 4,964,228 | A | * | 10/1990 | Coffman ..................... | 34/242 |
| 5,261,720 | A | * | 11/1993 | Lomax et al. ............... | 296/146.9 |
| 5,301,468 | A | * | 4/1994 | Kamezaki ................... | 49/225 |
| 5,566,505 | A | * | 10/1996 | Kamezaki ................... | 49/225 |
| 6,120,611 | A | | 9/2000 | Guan et al. | |
| 6,196,590 | B1 | * | 3/2001 | Kim ........................... | 280/830 |

FOREIGN PATENT DOCUMENTS

DE                1932726           *   1/1970

* cited by examiner

Primary Examiner—Gregory J. Strimbu
(74) Attorney, Agent, or Firm—Troxell Law Office PLLC

(57) ABSTRACT

An apparatus for sealing a vacuum chamber having a plurality of long cylinders for linearly moving first piston rods. The first piston rods connect with a frame elevator. The frame elevator has a second piston rod and guide stems parallel to the first piston rods. A lever, a transmitting rod and a connecting rod are synchronously moved, when the second piston rod is moved parallel to the guide stems by a short stroke cylinder. The transmitting rod is pivoted with a middle of the connecting rod. Direction-changing mechanisms are pivoted at the two ends of the connecting rod for horizontally moving a door to seal the vacuum chamber. The moving direction of the door pushed by the direction-changing mechanisms is perpendicular to the moving direction of the second piston rod so that the apparatus has a thin configuration.

11 Claims, 8 Drawing Sheets

APPARATUS FOR SEALING A VACUUM CHAMBER

FIELD OF THE INVENTION

The present invention generally relates to a vacuum process apparatus, such as the vacuum process apparatus for coating thin films on photoelectric or semiconductor devices, and more particularly to an apparatus for sealing a vacuum chamber.

BACKGROUND OF THE INVENTION

Vacuum process apparatus have been commonly used in many kinds of industries, applied to vacuum thin film coating process of workpieces such as liquid crystal substrates or semiconductor wafers. An operating environment inside the vacuum chamber must be maintained close to vacuum pressure. However, due to the different air pressures between the inside and the outside of vacuum chamber, the atmosphere is easy to leak into vacuum chamber through the entrance of workpiece.

An apparatus for sealing a vacuum chamber is disclosed in U.S. Pat. No. 6,120,611 "apparatus and method for hermetically sealing a chamber". It comprises a ball bearing and a photosensing element for reducing frictional force during hermetically sealing the chamber. It is a sealing apparatus installed at a cylindrical flange of the vacuum chamber for sealing the chamber hermetically, and the door is integrated with wafer loader so that the apparatus is uneasy to be used or installed individually.

SUMMARY

The main object of the present invention is to provide an apparatus for sealing a vacuum chamber. By means of levers, transmitting rods and connecting rods, a second piston rod pushed forward by a short stroke cylinder on the frame elevator drives a plurality of direction-changing mechanisms to horizontally move a door for sealing a vacuum chamber, so that the door of large area or with high weight may be driven efficiently.

The secondary object of the present invention is to provide an apparatus for sealing a vacuum chamber. Because of parallel arrangement of the first piston rods for vertically elevating the door, the second piston rod for horizontally pushing the door and guide stems, the shell body can be designed as flat type. Therefore, according to the present invention, the apparatus for sealing a vacuum chamber has a super thin configuration, so that the moving space of robot arm is not interfered by the chamber door.

In accordance with the apparatus for sealing a vacuum chamber of the present invention, it comprises a plurality of long stroke cylinders, a frame elevator and a door. The frame elevator is combined with a plurality of first piston rods, at least a second piston rod and at least a guide stem. The long stroke cylinders linearly move the first piston rods and the frame elevator. The frame elevator is combined with at least a short stroke cylinder connecting with the second piston rod so the second piston rod moves along a parallel direction of guide stems. The second piston rod is connected to middle of a connecting rod through a lever and a transmitting rod. A plurality of direction-changing mechanisms are pivoted at the two ends of the connecting rod. It is preferable that the guide stem is fixedly combined with a support frame inside the shell body. The support fame has a plurality of narrow openings for limiting the movement of the direction-changing mechanisms so that a plurality of direction-changing mechanisms pivoted on the door horizontally push the door to seal the vacuum chamber under the vertical movement of the second piston rod.

DETAILED DESCRIPTION OF THE PRESENT INVENTION

Figure 1:
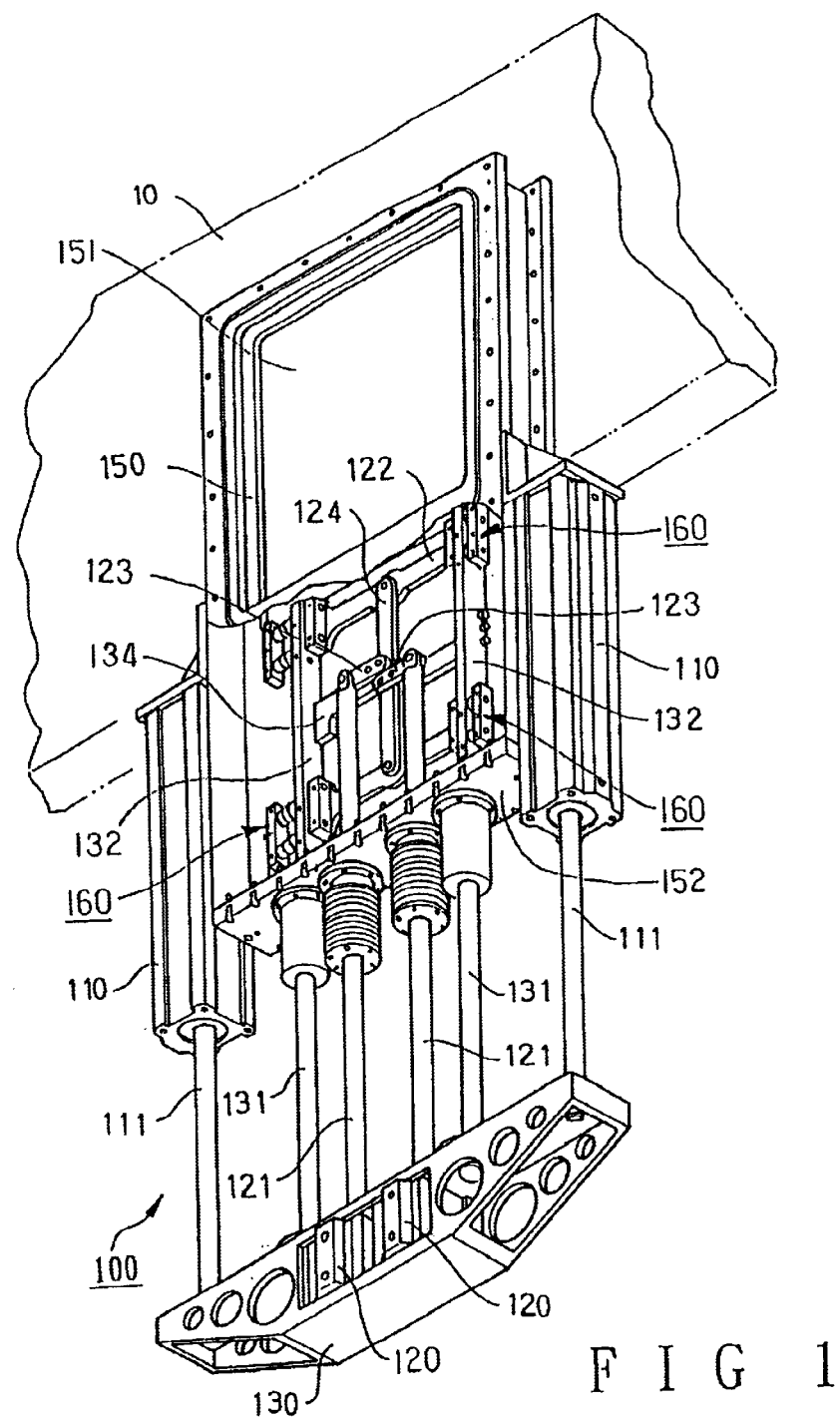
FIG. 1 is a perspective view of an apparatus for sealing a vacuum chamber in accordance with an embodiment of the present invention.

Referring to the drawings attached, the present invention will be described by means of the embodiments below.

Figure 2:
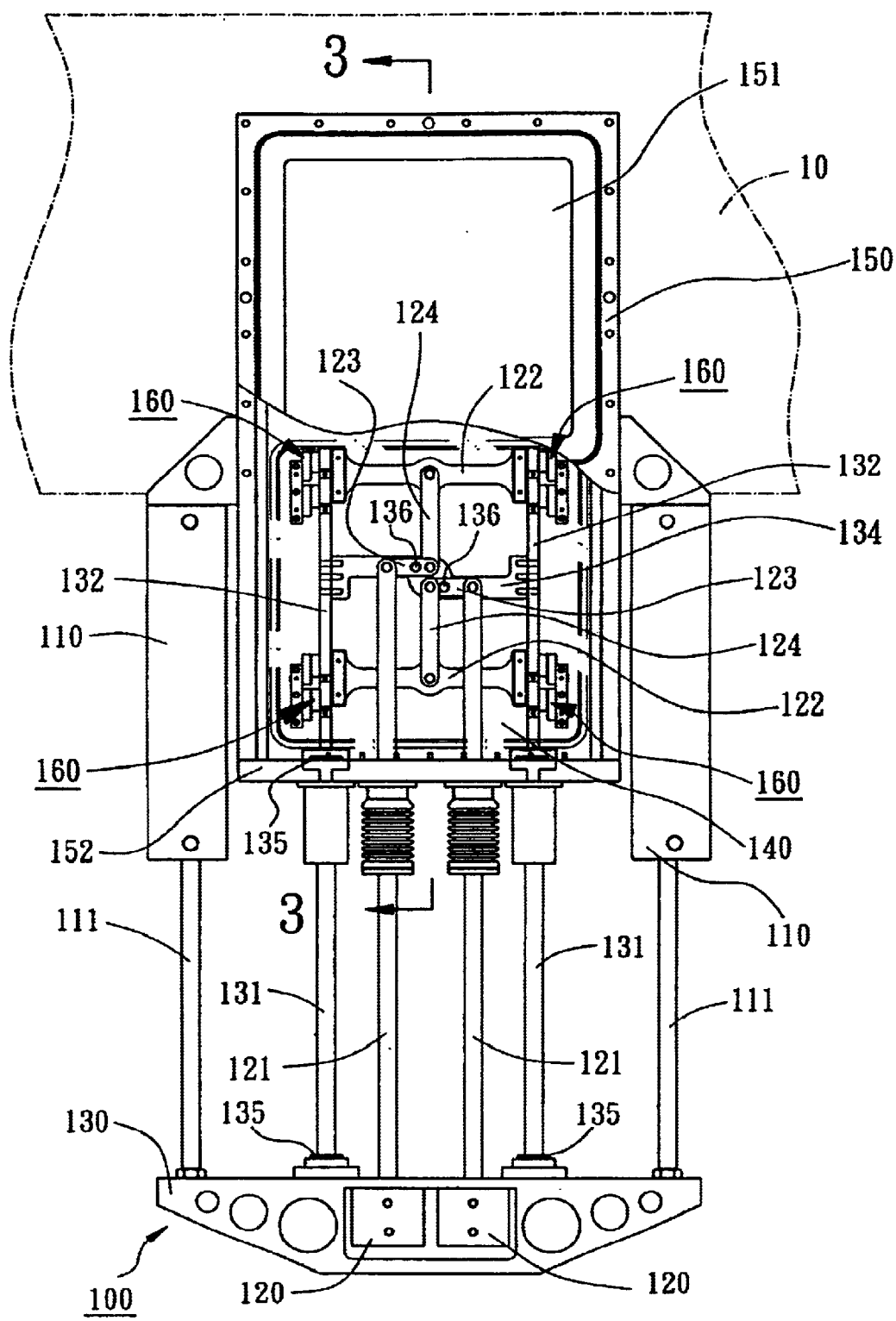
FIG. 2 is a front perspective view showing the apparatus for sealing a vacuum chamber on opening state in accordance with the embodiment of the present invention.
Figure 4:
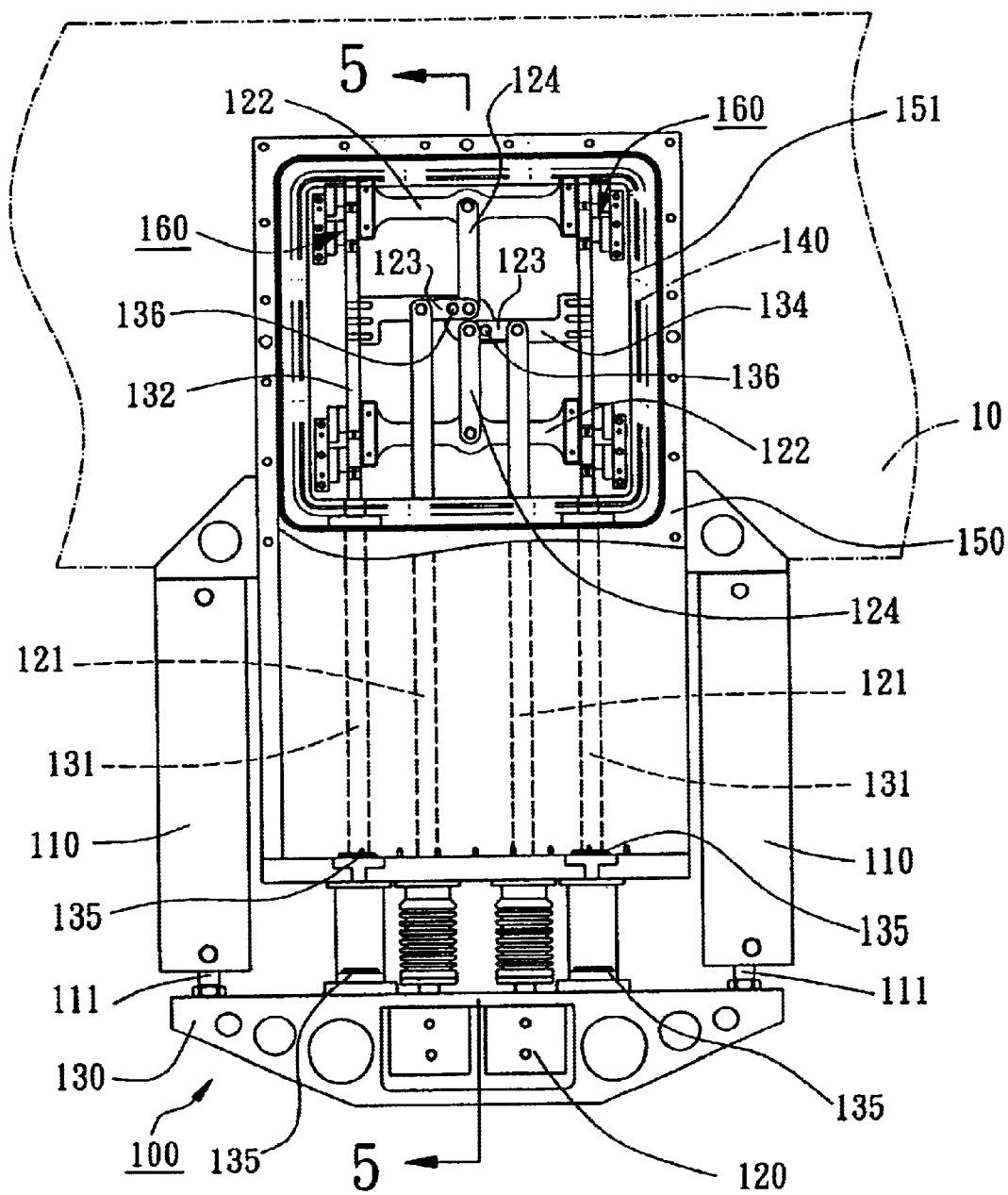
FIG. 4 is a front perspective view showing the apparatus for sealing a vacuum chamber after moving at the predetermined location in accordance with the embodiment of the present invention.

As shown in FIG. 1 and FIG. 2, an apparatus 100 for sealing a vacuum chamber comprises an elevating mechanism, a sealing mechanism, a door 140 and a shell body 150 for mounting on a vacuum chamber wall 10 of a vacuum chamber. The elevating mechanism is configured for vertically moving the door 140 up and down, which comprises a plurality of long stroke cylinders 110 and first piston rods 111. In this embodiment there are two sets of long stroke cylinders 110. One end of each first piston rod 111 movably connects with the corresponding long stroke cylinder 110 and the other end of the first piston rod 111 is fixedly connected with the frame elevator 130 of the sealing mechanism for vertically moving the frame elevator 130 to a predetermined point, also the door 140 connects with the frame elevator 130 by direction-changing mechanism 160 for moving up or down synchronously. The long stroke cylinders 110 make the first piston rods 111 linearly move to a predetermined location so the frame elevator 130 may move between two locations along a linear direction (as shown in FIG. 2 and FIG. 4).

The door 140 is installed inside the shell body 150 with proper shape such as rectangle, square or circle. In this embodiment the door 140 is in square configuration. The flat type shell body 150 has an opening 151 corresponding to the door 140. A guide plate 152 is fixed at one side of the shell 150, which has through holes for the guide stems 131 and the second piston rods 121 of the sealing mechanism moving in and passing through the shell body 150.

The sealing mechanism is configured for horizontally moving the door 140 to seal a vacuum chamber, which comprises a frame elevator 130 and a support frame 132.

Figure 3:
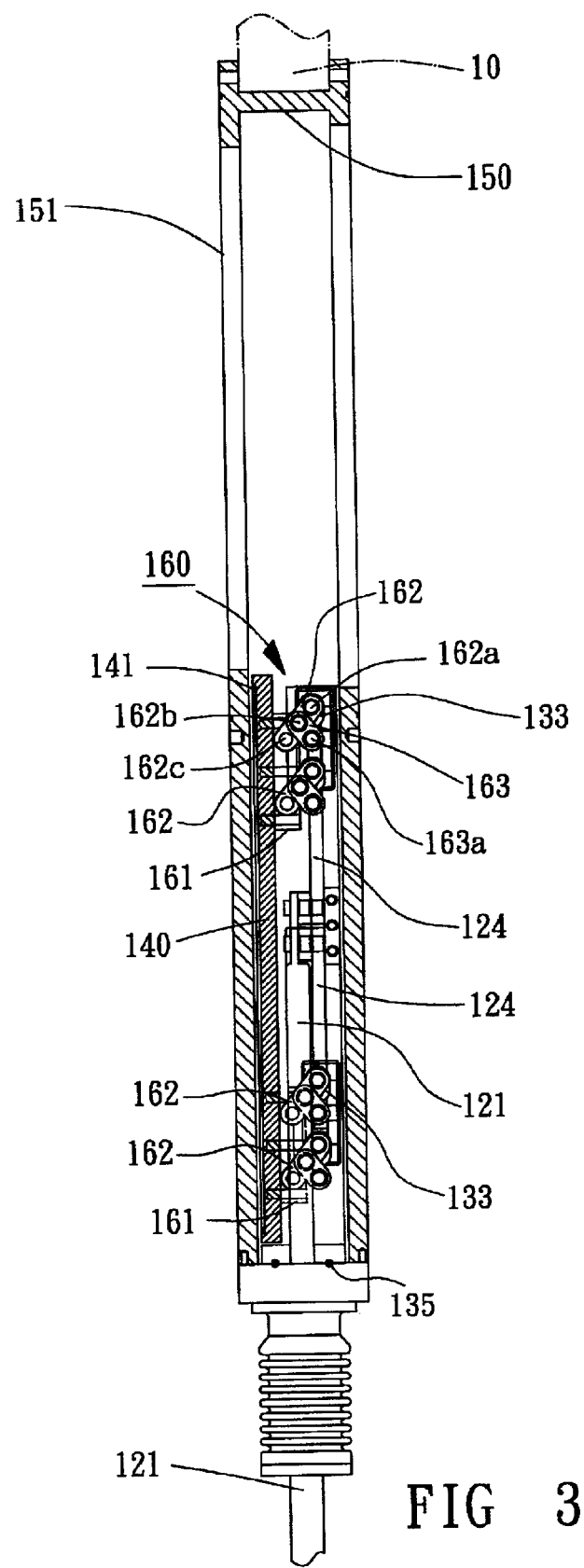
FIG. 3 is a cross-sectional view along line 3—3 in FIG. 2.

Two guide stems 131 are fixedly equipped at the inner side of the frame elevator 130 at respective first ends and pass through the guide plate 152 of shell 150, then guide stems 131 are mounted on the support frame 132 inside the shell 150 at respective second ends thereof. A plurality of narrow openings 133 are formed on the support frame 132 to provide moving spaces of pivoting axes at first ends 162*a* of sliding blocks 162 of direction-changing mechanisms 160 (as shown in FIG. 3). The support frame 132 has a fixed across bar 134 with supporting axes 136 for pivoting the levers 123. Besides, the O-rings 135 are fitted around the through holes of guide plate 152 where guide stems 131 and second piston rods 121 pass through in order to enhance air-tight and cushioning effect of mechanical movement.

Figure 6:
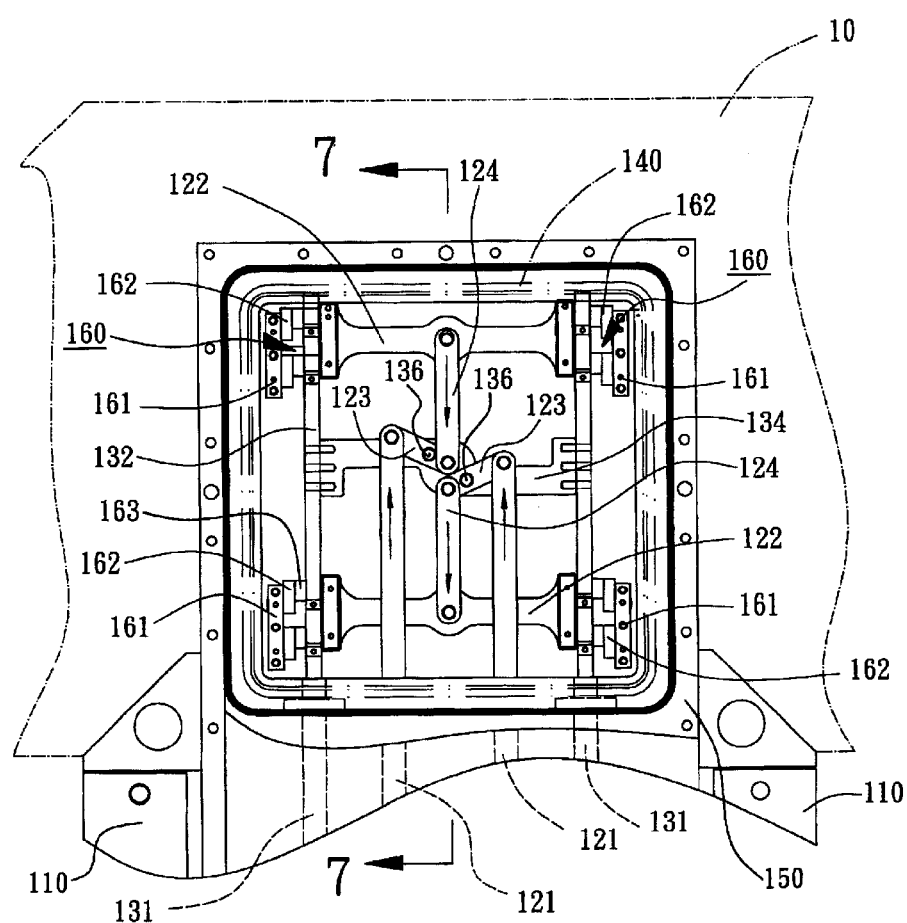
FIG. 6 is a front perspective view showing the apparatus for sealing a vacuum chamber under sealing state in accordance with the embodiment of the present invention.

Furthermore, at least a short stroke cylinder 120 is fitted on the frame elevator 130 for moving at least a second piston rod 121 to a predetermined location. In this embodiment two short stroke cylinders 120 are fitted on the frame elevator 130 to join two second piston rods 121. When the short stroke cylinders 120 push the second piston rods 121, the second piston rods 121 move parallel to the guide stems 131 (as shown in FIG. 4 and FIG. 6). Also, the first piston rods 111, the second piston rods 121 and the guide stems 131 are mutually parallel so the apparatus for sealing a vacuum chamber is flat shape.

As shown in FIG. 2 and FIG. 3, the second piston rods 121 passing through the guide plate 152 of shell 150 connect with one ends of the levers 123. The levers 123 connect with fixed across bar 134 of support frame 132 by supporting axes 136. The other ends of the levers 123 are pivoted with the transmitting rods 124. It is better that each supporting axis 136 is close to the corresponding transmitting rods 124 so the levers 123 have a transmission effect of leverage. Also, one end of transmitting rod 124 is pivoted to the middle of the connecting rod 122. The two ends of connecting rods 122 are pivoted with at least a direction-changing mechanism 160 respectively. The door 140 is moved horizontally by means of the direction-changing mechanisms 160 for sealing the opening 151 of shell 150.

Figure 7:
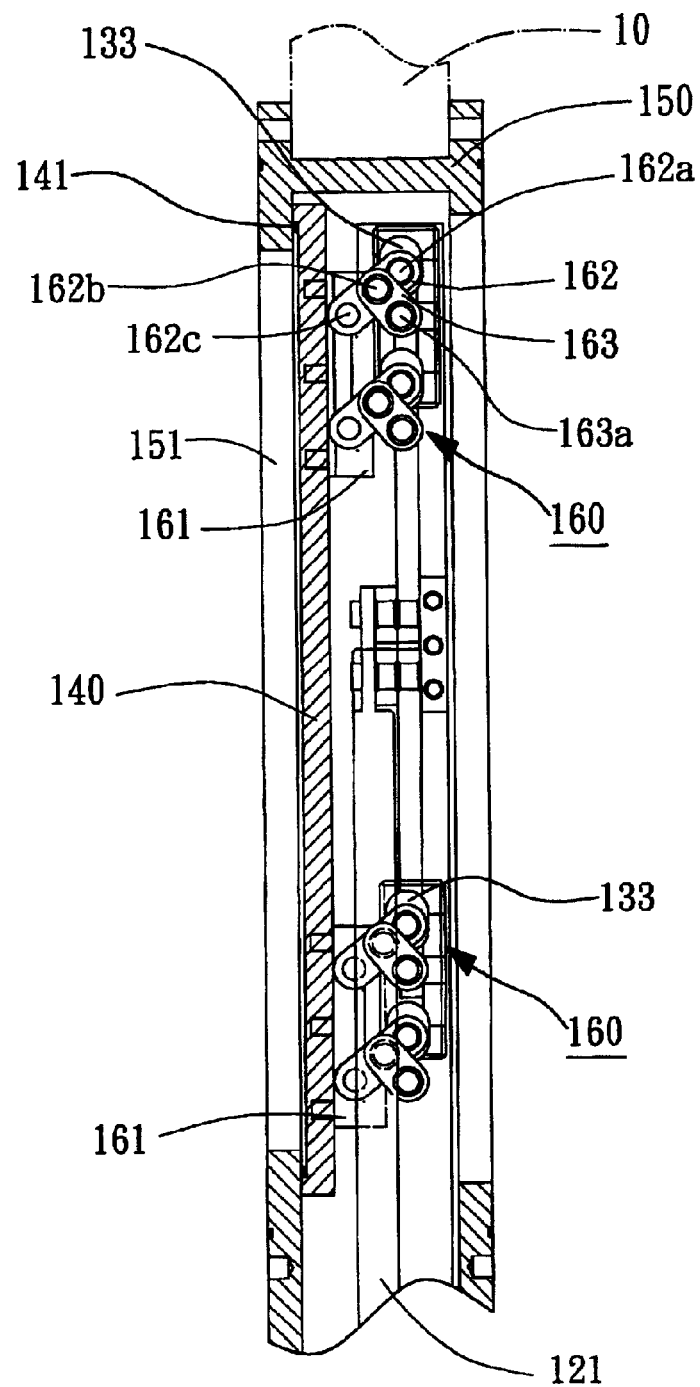
FIG. 7 is a cross-sectional view along line 7—7 in FIG. 6.

As shown in FIG. 3 and FIG. 7, each direction-changing mechanism 160 includes a sliding block 162, a support block 163 and a mounting block 161. The mounting block 161 is fixedly fitted on the door 140. The second end 162*c* of the sliding block 162 is pivoted with the mounting block 161. And the first end 162*a* of the sliding block 162 is pivoted with the connecting rod 122. The moving space of pivot axis at first end 162*a* of the sliding block 162 is limited by narrow opening 133 of the support frame 132. Also, one end of the support block 163 is pivoted at the middle point 162*b* of the sliding block 162 and the other end 163*a* of the support block 163 is pivoted with the support frame 132.

As shown in FIG. 2 and FIG. 3, when the apparatus 100 for sealing the vacuum chamber mentioned above is on start state, the long stroke cylinders 110 linearly stretch out the first piston rods 111, so that the frame elevator 130 moves to a direction in which is far away from long stroke cylinder 110 and at the same time the door 140 also goes away from the opening 151 of shell 150 to open the chamber. As shown in FIG. 3, a larger interval is kept between the first end 162*a* of sliding block 162 and the end 163*a* of the support block 163 during vertical moving process, so there is a gap between the door 140 and the sealing surface of opening 151 of shell 150 for moving the door 140 without friction caused by contacting the shell 150.

Figure 5:
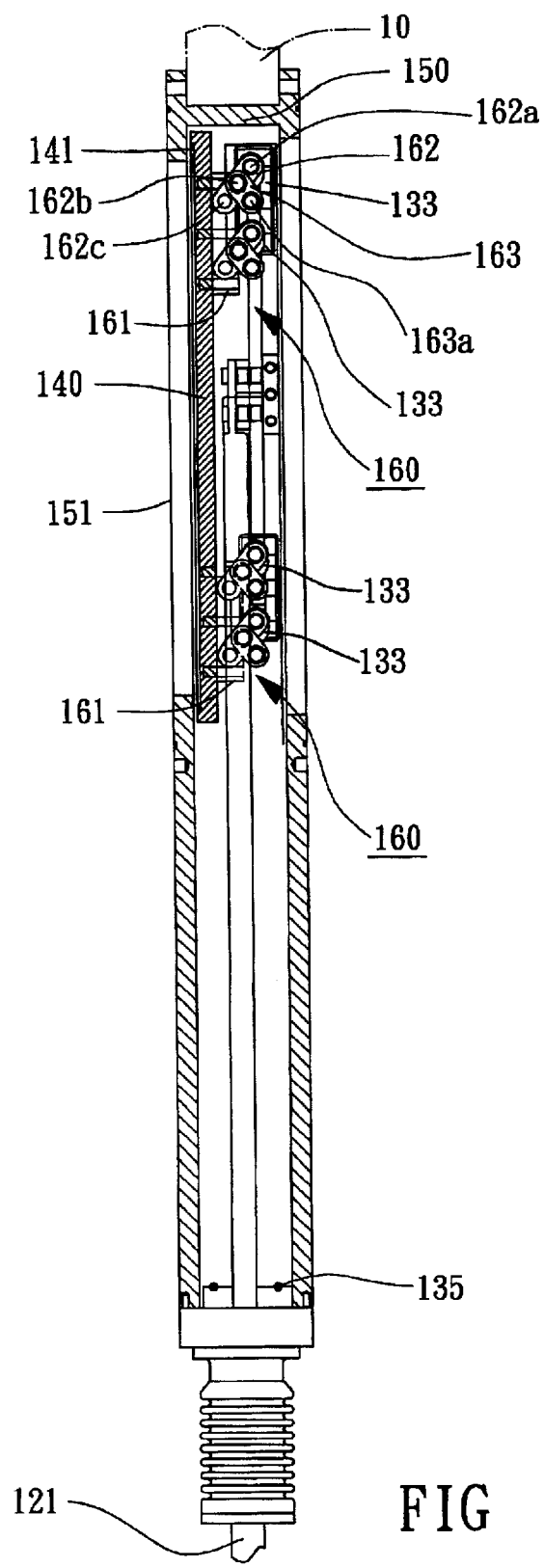
FIG. 5 is a cross-sectional view along line 5—5 in FIG. 4.

When the vacuum chamber is going to be sealed, the elevating mechanism is in action. As shown in FIG. 4 and FIG. 5, the long stroke cylinders 110 linearly withdraw the first piston rods 111 from a predetermined point, then, the frame elevator 130 moves to the direction close to the long stroke cylinders 110 and simultaneously the door 140 moves close to the opening 151. Meantime, as shown in FIG. 5, the short stroke cylinders 120 are out of action so the gap between the first end 162*a* of sliding block 162 and the end 163*a* of support block 163 is maintained. Due to the unsealed gap between the door 140 and the opening 151 of shell 150, the door 140 can smoothly be vertically moved to the predetermined position without contacting the shell 150 before horizontally sealing the opening 151.

Thereafter in order to seal the opening 151 of shell 150 completely, the apparatus 100 starts to drive the sealing mechanism after the first piston rods 111 move to a predetermined point. As shown in FIG. 6 and FIG. 7, the second piston rod 121 is connected with one end of a lever 123. The supporting axis 136 of the lever 123 is pivoted to the fixed across bar 134 of support frame 132. The other end of the lever 123 is pivoted with a transmitting rod 124 and further the transmitting rod 124 is connected with middle of a connecting rod 122. While the second piston rods 121 are driven by the short stroke cylinders 120, the levers 123 is rotated at supporting axes 136 and synchronously drive the transmitting rods 124 and the connecting rods 122. The direction-changing mechanisms 160 on two ends of the connecting rods 122 also are driven, so that the first ends 162*a* of sliding blocks 162 of direction-changing mechanisms 160 move close to the ends 163*a* of support blocks 163. According to Cardan circle direction-changing theory, while there is a variation of interval between the first end 162*a* of sliding block 162 and the end 163*a* of support block 163 (become smaller), the second ends 162*c* of sliding blocks 162 of direction-changing mechanisms 160 will horizontally move. Therefore, the mounting blocks 161 are pushed linearly and the door 140 synchronously contacts the sealing surface of opening 151 of shell 150 for sealing the opening 151 of shell 150. The moving direction of the door 140 pushed by direction-changing mechanisms 160 is perpendicular to the moving direction of the second piston rods 121 to completely seal the opening 151 of shell 150. It is preferable that an elastic ring cushion 141 is fitted at the perimeter of compression surface of the door 140 for increasing the air-tight effect of the door 140.

According to the present invention, the apparatus 100 for sealing a vacuum chamber can synchronously drive the multiple direction-changing mechanisms 160 evenly connecting to the door 140 by means of levers 123, transmitting rods 124 and connecting rods 122. Therefore, the vacuum chamber can be sealed reliably and economically by a door with large area or big weight. Also, the guide stems 131 of sealing mechanism are disposed parallel to the second piston rods 121 and the first piston rods 111, and those are even disposed on a same plane so that the shell 150 can be designed as a flat type. Therefore, the apparatus 100 for sealing a vacuum chamber of the present invention has a super thin configuration and the moving space of robot arm is not interfered while opening or sealing a chamber door.

Figure 8:
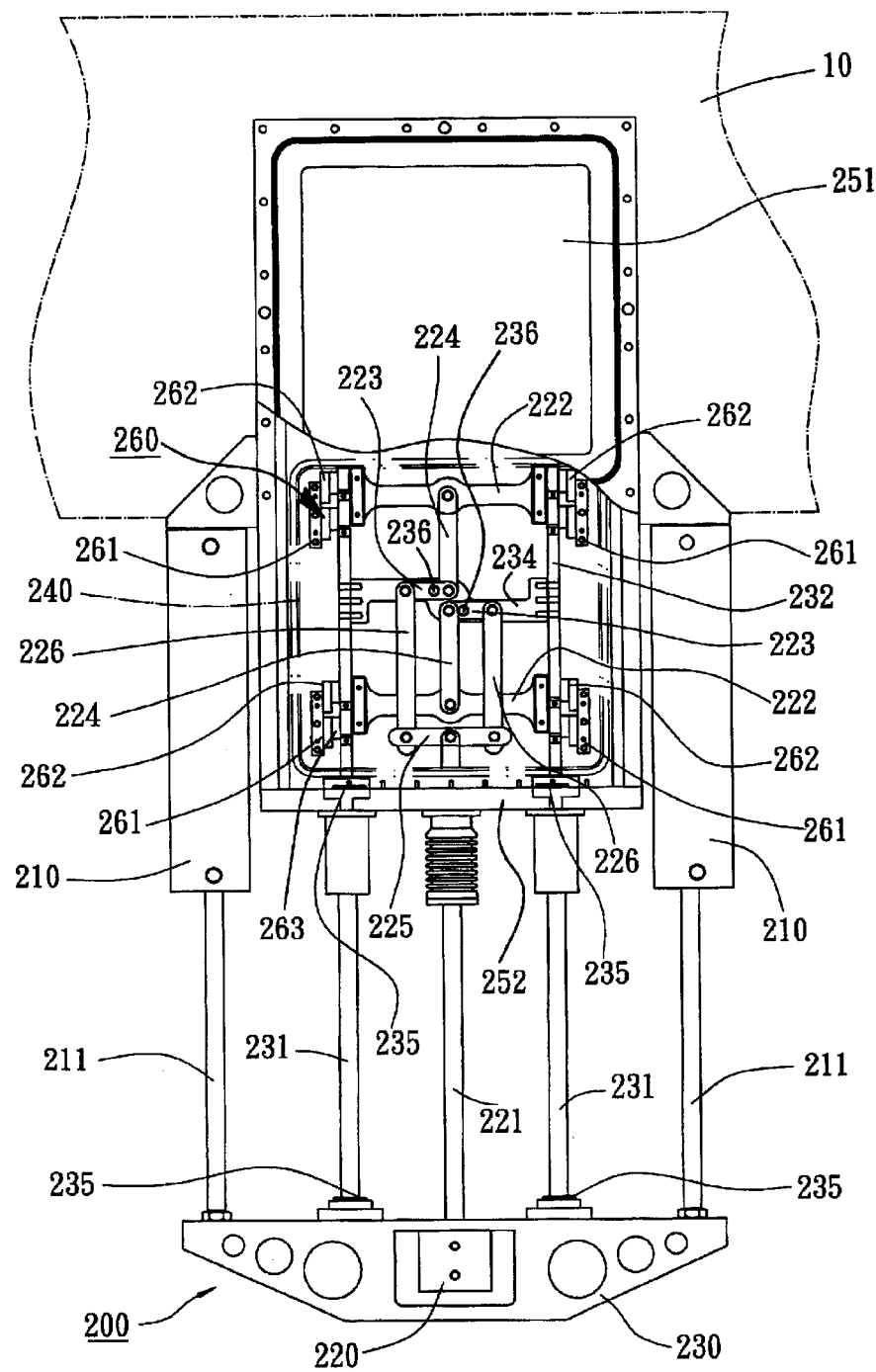
FIG. 8 is a front perspective view showing an apparatus for sealing a vacuum chamber in accordance with another embodiment of the present invention.

In the second embodiment of the present invention illustrated in FIG. 8, an apparatus 200 for sealing a vacuum chamber includes a plurality of direction-changing mechanisms 260 synchronously driven by a second piston rod 221 only, it comprises long stroke cylinders 220, first piston rods 211, direction-changing mechanisms 260, connecting rods 222, levers 223, transmitting rods 224, guide stems 231, door 240, shell 250 and so on are the same as the first embodiment. The apparatus 200 further comprises a frame elevator 230 that fixedly fits a plurality of the first piston rods 211, parellel guide stems 231 and a short stroke cylinder 220. The other end of the first piston rods 211 are enclosed by the corresponding long stroke cylinders 210 for moving the frame elevator 230 to a predetermined point. The guide stems 231 are fixedly connected with a support frame 232 passing through the guide plate 252 of shell 250. The support frame 232 has narrow openings (not shown in drawings) for limiting the direction-changing mechanisms 260. It is better that a plurality of O-rings 235 are formed on the guide plate 252 around the guide stems 231 and the second piston rod 221 for increasing air-tight effect. The short stroke cylinder 220 encloses one end of the second piston rod 221 that is parallel to and located between the first piston rods 211 and the guide stems 231 so that the second piston rod 221 may move to a predetermined point along a parallel direction of the guide stems 231. Also the second piston rod 221 is connected to the middle of a push rod 225. And the two ends of the push rod 225 are pivoted with two second transmitting rods 226 respectively. Each second transmitting rod 226 is pivoted with the corresponding one end of the lever 223 and the levers 223 are pivoted on the fixed across bars 234 of support frames 232 by support axes 236. The other end of each lever 223 is pivoted with a transmitting rod 224 and the transmitting rod 224 is pivoted with the middle of a connecting rod 222. The two ends of each connecting rod 222 are pivoted with a plurality of direction-changing mechanisms 260 respectively, such as mounting blocks 261, sliding blocks 262 and support blocks 263, etc. When the second piston rod 221 extends from the short stroke cylinder 220, the connecting of push rods 225, the second transmitting rods 226, levers 223, transmitting rods 224 and connecting rods 222, the direction-changing mechanisms 260 synchronously are driven to push the door 240 for evenly sealing the opening 251 of shell 250.

The above description of embodiments of this invention is intended to be illustrative and not limiting. Other embodiments of this invention will be obvious to those skilled in the art in view of the above disclosure.

What is claimed is:

1. An apparatus for sealing a vacuum chamber comprising:
    a frame elevator connected to first ends of a plurality of guide stems;
    a plurality of first stroke cylinders having a plurality of first piston rods connected to the frame elevator for linearly moving the frame elevator;
    a support frame fixedly connected to second ends of the guide stems and pivotally connected with a plurality of levers;
    at least one second stroke cylinder mounted in the frame elevator, the second stroke cylinder having a second piston rod that moves parallel to the guide stems, the first piston rods passing into the support frame to control the plurality of levers,
    a connecting rod movably located within the support frame;
    a transmitting rod connecting the plurality of levers and a middle of the connecting rod;
    a plurality of direction-changing mechanisms pivotally connected to opposing ends of the connecting rod; and
    a door pivotally connected to the direction-changing mechanisms;
    such that, when the second piston rod of the second stroke cylinder moves the plurality of levers, the transmitting rod and the connecting rod, the door is moved linearly in a direction perpendicular to a longitudinal axis of piston rod.

2. The apparatus according to claim 1, wherein each direction-changing mechanism comprises a sliding block, a support block and a mounting block, the mounting bocks are connected with the door, a first end of each of the sliding blocks is pivotally connected to the connecting rod by a respective pivot element, each of the pivot axis, the pivot elements passing through a corresponding narrow opening of the support frame, a support block second end of each of the sliding blocks is pivot connected to a respective one of the mounting blocks, and each support block is pivotally connected to a middle of a respective one of the sliding blocks and the support frame.

3. The apparatus according to claim 1, wherein the support frame includes a fixed across bar supporting the plurality of levers.

4. The apparatus according to claim 1, further comprising a ring cushion located on the door.

5. The apparatus according to claim 1, further comprising an additional second piston rod and an additional transmitting rod, the additional transmitting rod is pivotally connected between an additional connecting rod and the plurality of levers, the additional transmitting rod is pivotally connected to a middle of the additional connecting rod.

6. An apparatus for sealing a vacuum chamber comprising:
    a flat shell having an opening;
    a door movably located in the flat shell;
    a plurality of direction-changing mechanisms located on the door;
    an elevating mechanism located on the flat shell for moving the door, the elevating mechanism comprising a plurality of first stroke cylinders having a plurality of first rods; and
    a sealing mechanism controlling the direction-changing mechanism to seal the door in the opening, the sealing mechanism comprising a frame elevator, a support frame, a guide stem and a second stroke cylinder, the guide stem fixedly connecting with the frame elevator and the support frame, the second stroke cylinder mounted in the frame elevator, the second stroke cylinder having a second piston rod that moves parallel to the first rods and; the shell has a guide plate fixedly mounted there to, the guide stem and the second piston rod are inserted through the guide plate.

7. The apparatus according to claim 6, wherein each direction-changing mechanism includes a sliding block, a support block and a mounting block, the sealing mechanism includes a connecting each of the mounting blocks is mounted on the door, a first end of each of the sliding blocks is pivotally connected to the connecting rod by a respective pivot element, a second end of each of the sliding blocks is pivotally connected to a respective one of the mounting blocks, each support block is pivotally connected to a middle of a respective one of the slide blocks and the support frame.

8. The apparatus according to claim 7, wherein the support frame has a plurality of narrow openings to provide moving spaces for the pivot elements.

9. The apparatus according to claim 6, wherein the support frame includes a fixed across bar.

10. The apparatus according to claim 6, further comprising a ring cushion on the door.

11. The apparatus according to claim 6, wherein the sealing mechanism includes a lever and two transmitting rods, one of the two transmitting rods is pivotally connected between the lever and a middle of the connecting rod.

* * * * *